United States Patent [19]

Fang et al.

[11] Patent Number: 5,429,069
[45] Date of Patent: Jul. 4, 1995

[54] METHOD FOR GROWING DIAMOND CRYSTALS UTILIZING A DIFFUSION FED EPITAXY

[76] Inventors: Pao-Hsien Fang, 156 Common St., Belmont, Mass. 02178; Welville B. Nowak, 17 Furbush Ave., West Newton, Mass. 02165

[21] Appl. No.: 728,637

[22] Filed: Jul. 11, 1991

[51] Int. Cl.⁶ .............................................. C30B 25/02
[52] U.S. Cl. ........................................ 117/90; 117/84
[58] Field of Search ....... 156/610, 613, 614, DIG. 68; 423/446

[56] References Cited

U.S. PATENT DOCUMENTS

| | | | |
|---|---|---|---|
| 4,767,608 | 8/1988 | Matsumoto et al. | 423/446 |
| 4,927,619 | 5/1990 | Touji | 423/446 |
| 4,953,499 | 9/1990 | Anthony et al. | 156/DIG. 68 |
| 4,997,636 | 3/1991 | Prins | 423/446 |

OTHER PUBLICATIONS

"Laser Method for Synthesis and Processing of Continuous Diamond Films on Nondiamond Substrates"; Narayan et al.; *Science,* vol. 252; pp. 416–418.

*Primary Examiner*—R. Bruce Breneman
*Assistant Examiner*—Felisa Garrett
*Attorney, Agent, or Firm*—Richard J. Birch

[57] ABSTRACT

A method for growing diamond crystals or films by diffusing carbon through one side of a carbon diffusable substrate, such as metal or alloy, and outdiffusing the carbon on opposite side of the substrate is disclosed. The requirements for the metal or the alloy medium are: (1) low solubility of carbon in the medium so that all carbon will not be trapped in the medium; (2) no stable compound is formed between carbon and the medium in the operating temperature region; (3) a proximity to the lattice constant of diamond; and (4) an adequate diffusion rate at the operating temperature to grow the diamond efficiently.

20 Claims, No Drawings

METHOD FOR GROWING DIAMOND CRYSTALS UTILIZING A DIFFUSION FED EPITAXY

BACKGROUND OF THE INVENTION

During the past decade there has been a proliferation of methods to grow diamond crystals and films. Most of these methods are based on decomposition of a gaseous hydrocarbon source, and a common substrate is single crystal silicon. Some metals, such as molybdenum and nickel, also have been used as substrates. These substrates are frequently scratched with fine diamond particles and these particles become seeds for growth. Reviews of these works can be found in the literature, and an example is W. A. Yarbrough and R. Messier, Science 247, 688 (1990). The role of the diamond seed is given by S. Iijima, Y. Aikawa, and K. Buba, Applied Physics Letters 57, 2646 (1990).

Recently, a substantially new method has been presented by J. F. Prins, and H. L. Gaigher, Second International New Diamond Science and Technology Conference, Washington, D.C., Sep. 23-27, 1990. In this method, carbon ions are implanted into a hot substrate, and an outdiffusion of the carbon onto the substrate surface forms a heteroepitaxial growth of diamond. The authors call this method "implanted-atom-outdiffusion-epitaxy ('IAOE')". The IAOE method has three disadvantages:

1. The penetration depth of ion implantation is limited to tens of nanometers and all the diamond growth is limited to this superficial region.
2. The use of ion implantation to place a large quantity of carbon ions through either a high ion beam current or a prolonged implantation time is neither economical nor practical. One drawback is a limitation of the thickness of the diamond layer to a submicron dimension. Moreover, in order to produce a thicker film, the process must be altered by using, for example, CVD to grow epitaxially on the ion implantation produced film.
3. High energy carbon ions produce radiation damage on the substrate and destroy the crystal perfection of the substrate. The resulting defects can be transmitted to the epitaxial layer with a concomitant agglomeration of defects.

It is accordingly a general object of the invention to eliminate the disadvantages of the IAOE method.

BRIEF DESCRIPTION OF THE INVENTION

The method of the present invention utilizes an epitaxial growth from a modulated carbon source. The modulation is achieved by a controlled diffusion of carbon (C) through a solid medium. One distinction of the present growth mechanism from the gaseous phase deposition on a substrate is that in gaseous deposition the first layer of C is absorbed on the substrate surface to form diamond, subsequent deposition becomes homoepitaxial on diamond. In the present invention the C migrates from the "back" surface of the substrate through to the "front" surface to form diamond. Subsequent growth maintains the same growth configuration by forming diamond on the substrate interface between the surface and newly formed diamond layer, and the continous growth elevates the diamond layer. The growth is at the interface of the substrate surface and the diamond layer. Under such conditions the chemical nature of a source species such as $CH_3^+$ to form $sp^3$ diamond configuration is not required. At the same time, a high temperature requirement to dissociate source material (such as $CH_4$ to a typical temperature of 900° C.) in chemical vapor deposition process can be eliminated.

In order to achieve the crystallization needed to grow diamond, the following conditions are required:

1. Low solubility of C in the substrate medium. The low solubility lowers the saturation concentration and enhances an outdiffusion to the free surface of the medium while the other surface is in an intimate contact with C.
2. No stable carbide composition. The system should not trap the in-diffused C to form a stable compound. If there is a compound at a certain temperature region, this temperature region is excluded in the crystal growth process.
3. Lattice constant matching. This is a general requirement to realize an epitaxial growth of a crystal.
4. Sufficiently high diffusion rate. The diffusion rate of C in the substrate medium should be sufficiently high so that the crystal can form at a moderately low temperature and in a relatively short time. The use of a high temperature or a prolonged growth time is not only inefficient in a production environment, but it also can transform the formed diamond into graphite.

DETAILED DESCRIPTION OF THE INVENTION

A detailed discussion of the above four points with examples to illustrate the invention are presented below.

Materials with low C solubility are represented by copper (Cu), nickel (Ni), and some noble metals. These materials in general do not form a compound phase, or the compound phase is not stable, particularly in the temperature range of the crystal growth of the present invention. For example, in the C—Cu system there is no binary compound and the solubility of C in Cu is very low as described by the phase diagram. There is a general increase of the solubility as the temperature is increased. However, even at a high temperature approaching the melting point of Cu, the solubility is only about 0.001 atomic percent of C in Cu.

The lattice constants of Cu, diamond, and some other materials are listed in the following Table 1 along with their melting points:

TABLE 1

| Material | Lattice Constant (Cubic) (Angstroms) | Melting Temperature (°C.) |
|---|---|---|
| diamond | 3.57 | not applicable |
| copper | 3.61 | 1082 |
| nickel | 3.54 | 1441 |
| copper-nickel alloy | 3.53–3.66 | 1260–1330 |
| iron-nickel (FeNi) | 3.57 | 1440 |

Another example is the C—Ni system. In this system the solubility of C is low, in the range of a few atomic percent in the range 700° to 1950° C. (M. Hansen, Constitution of Binary Alloys, McGraw-Hill, NY 1958, p.374). This system, in low C region, has a eutectic temperature of 1307°–1310° C., at a C concentration of 9 to 11 atomic percent. These ranges of values indicate uncertainty from different reports in the literature.

The diamond crystallization method of the present invention follows:

Starting with a contact between 100% C and 100% Ni, when the system temperature is raised to T and is held at this value isothermally, there will occur a Ni diffusion into C and vice versa. The relation between the diffusion coefficient D, the diffusion time t and the diffusion length L, is dependent on the geometrical configuration and the diffusion source. For a first order estimation, the following relation can be adopted:

$$L^2 = Dt \qquad (1)$$

The value of D can be evaluated from the following equation:

$$D = D_o exp(-E/kT) \qquad (2)$$

where E is the activation energy in electron volts, k is the Boltzmann constant $(8.62 \times 10^{-5})$ and T is the absolute temperature. For diffusion of C in Ni, $D_o = 0.012$ cm$^2$/sec and $E = 1.47$ electron volts (I. I. Kovenskiy, Fiz. metal. metallovid. 16, 613 (1963). Based on this information, one can calculate the related values of L, T, and t Since L appears as $L^2$ and D as an exponential dependence on T, these two quantities change more rapidly than t. Therefore in Table 2, a relation between L and T is set forth, based on an arbitrary value of one hour $(3.6 \times 10^3$ sec.).

TABLE 2

| L(um) | T(K) | T(°C.) |
|---|---|---|
| 25 | 1086 | 813 |
| 10 | 973 | 700 |
| 1 | 770 | 498 |
| 0.1 | 638 | 385 |
| 0.01 (= 10 nm) | 595 | 271 |

For convenience, T is given both in absolute K and in Celsius. Moreover, L is in units of micrometers. At very low T, the rate of crystal growth will be retarded, or cannot be formed in a practical manner. However, the introduction of carbon in the diffusion mechanism of the present invention remains a viable method.

At a specific temperature T, there is a solubility limit S(T), the value of which sets the upper limit of the concentration of C in Ni. After a period of time, the concentration of C becomes equal to S(T), and the diffusion ceases unless there is a removal process of C.

A removal process is an important part of the present invention: When C reaches the outer surface of Ni, it can align with other C and can proceed to a nucleation and a crystal growth when other C is sufficiently mobile, such as a high substrate temperature. In this growth process on a Ni surface, since Ni has lattice parameters very close to that of diamond, C can be formed heteroepitaxially as diamond. The present invention exploits this epitaxy mechanism. The supply of C to the Ni surface is controlled by the diffusion rate of C in Ni. The ramification of this crystal growth process is reflected in the involved growth condition of the present invention.

An important central parameter is the temperature T of the substrate. The value of temperature determines the solubility value S(T), the crystal growth rate r, the morphology, and the stability of the product. The product can be one of the polytropic forms of carbon, including amorphous carbon, diamond, and graphite, and temperature will be controlling factor.

The value of S(T) can be found from the phase diagram. A constraint which should be observed in the growth of a single phase material is that the maximum T should be below that of the liquidus line such that a mixed phase would not occur on cooling to terminate the growth process.

As a general rule, r increases with T and it would be advantageous for practical applications to increase r. However, too high a value of r can lead to an intrusion of imperfections and results in a poorly formed crystal.

Finally, diamond, being an unstable form, can transform into graphite during a high temperature process, or a direct growth of graphite instead of diamond. The transformation and formation is a function of T and the processing time t. Qualitatively, at a sufficiently long t and high enough T, the graphite form occurs.

Ambient conditions can also affect the stability of a particular form of crystal, such as a vacuum to eliminate oxidation, and hydrogen to inhibit the growth of graphite and thus to enhance the stability of diamond.

In the following, some examples of processes are illustrated.

EXAMPLE 1

Starting with a thin foil of Ni, one surface of the foil is coated with a C film. The rectangular strip of Ni is directly heated by current passing through it from two electrodes (one on each end) in a vacuum chamber of approximately $1 \times 10^{-6}$ torr pressure. The electric current produces an ohmic heating to a desired temperature. For example, a Ni foil of 25 micrometers thickness, 1 cm $\times$ 2.5 cm in area, when a current of 20 Amperes is applied along the long dimension, a steady state temperature of 880° C. is reached in about a minute. By holding at this temperature, an isothermal diffusion proceeds, and C atoms diffuse through the interior of the Ni foil and appear on the free surface which has no C deposit initially, and diamond nucleation and growth occur. This diamond formation process is enhanced and graphitization is inhibited when the system is maintained in a high vacuum or hydrogen gas ambient of pressure in the range of 10 to 100 Torr, or in a mixture of hydrogen and argon or hydrogen and nitrogen. The process is completed in a time period of 30 minutes.

EXAMPLE 2

Instead of Ni, when Cu is used, the parameters are different because of the lower melting point and higher electrical and thermal conductivities of Cu over those of Ni. There is no literature information that we are aware of on the diffusion coefficient of C in Cu, but our observations show that diamond in this system grows at a lower temperature of about 800° C. and at a faster rate than in the case of the C—Ni system.

EXAMPLE 3

According to Table 1, since the copper-nickel alloy (monel) can have closer lattice parameters to diamond than Cu or Ni, monel provides a better epitaxial growth condition than either Cu or Ni. The treatment procedure is the same as in the preceeding examples.

There are various methods to deposit the C source. One method is to evaporate C from graphite heated to a high temperature, for example by an electron beam. Another method is to paint the "back" surface of the substrate medium with a paste of C emulsion, for example by dissolving fine graphite powder in a viscous liquid such as glycerin or ethylene glycol. Another paste of C is a fine carbon black powder dispersed in viscous liquid, commercially available as a paint material. C also can be supplied by a decomposition of hydrocarbon compounds.

Once C is deposited, diffusion can be carried out by an appropriate heating, for example by an ohmic heating of the substrate. Another method is to place the C-metal system in a furnace. The ambient temperature of the furnace is controlled together with a high vacuum or at a low pressure protective gas such as hydrogen, argon, or nitrogen is contained within the furnace.

Using the method of the present invention, one can also grow diamond on a foreign substrate by first depositing a layer of the metals and alloys described herein, and subsequently carrying out a deposition of carbon and a diffusion of carbon through the metal host.

In order to grow a large diamond film, the substrate should have large sized crystal grains. When the substrate is a single crystal, an epitaxial growth of single crystal diamond can be obtained. At the other extreme the substrate has uniformly distributed microcrystals or nanocrystals, and microcrystal or nanocrystal diamond can be obtained.

What we claim is:

1. A method for epitaxially growing diamond crystals from a modulated carbon source, said method comprising the steps of:
   (1) positioning a carbon diffusible substrate having a first surface and a second surface and a lattice parameter proximating that of diamond;
   (2) placing carbon on the first surface of the substrate; and,
   (3) heating the carbon and the substrate to a temperature that produces diffusion of the carbon from the first surface of the substrate through the substrate to the second surface thereof to form a diamond crystal thereon.

2. The method of claim 1 wherein the substrate is a metal.

3. The method of claim 2 wherein the metal is Ni.

4. The method of claim 2 wherein the metal is Cu.

5. The method of claim 1 wherein the substrate is an alloy of Ni and Cu.

6. The method of claim 1 wherein the substrate is a single crystal so that a single crystal of diamond is formed thereon.

7. The method of claim 1 wherein the substrate is polycrystalline so that diamond crystals having a similar grain size distribution to that of the substrate are formed on the second surface of the substrate.

8. The method of claim 1 wherein the carbon is placed on the first side of the substrate by evaporative deposition.

9. The method of claim 1 wherein the carbon and substrate heating occurs in a pressure below $1 \times 10^{-5}$ Torr.

10. The method of claim 1 wherein the carbon and the substrate are heated in a gas.

11. The method of claim 10 wherein the gas is hydrogen.

12. The method of claim 10 wherein the gas is a mixture of hydrogen and argon.

13. The method of claim 10 wherein the gas is a mixture of hydrogen and nitrogen.

14. The method of claim 1 wherein the substrate is an alloy of Fe and I.

15. The method of claim 1 wherein the substrate is nanocrystal so that diamond crystals having a similar grain size distribution to that of the substrate are formed on the second surface of the substrate.

16. The product of the process of claim 1.

17. A method for epitaxially growing diamond crystals from a modulated carbon source, said method comprising:
   (1) positioning a carbon diffusable substrate having a first surface and a second surface and a lattice parameter proximating that of diamond;
   (2) placing a paste of carbon emulsion on the first surface of said substrate; and
   (3) heating the carbon and the substrate to a temperature that produces diffusion of the carbon from the first surface of the substrate through the substrate to the second surface thereof to form a diamond crystal thereon.

18. A method for epitaxially growing diamond crystals from a modulated carbon source, said method comprising:
   (1) positioning a carbon diffusable substrate having a first surface and a second surface and a lattice parameter proximating that of diamond;
   (2) placing a liquid suspension of carbon black on the first surface of said substrate; and,
   (3) heating the carbon and the substrate to a temperature that produces diffusion of the carbon from the first surface of the substrate through the substrate to the second surface thereof to form a diamond crystal thereon.

19. A method for epitaxially growing diamond crystals from a modulated carbon source, said method comprising:
   (1) positioning a carbon diffusable substrate having a first surface and a second surface and a lattice parameter proximating that of diamond;
   (2) placing carbon from a decomposition of hydrocarbon on the first surface of said substrate; and,
   (3) heating the carbon and the substrate to a temperature that produces diffusion of the carbon from the first surface of the substrate through the substrate to the second surface thereof to form a diamond crystal thereon.

20. The product of the process of claim 2, 5, 6, 7, 8, 17, 18, 19, 9, or 13.

* * * * *